United States Patent
Hsu

(10) Patent No.: US 7,382,057 B2
(45) Date of Patent: Jun. 3, 2008

(54) SURFACE STRUCTURE OF FLIP CHIP SUBSTRATE

(75) Inventor: Shih-Ping Hsu, Taoyuan County (TW)

(73) Assignee: Phoenix Precision Technology Corporation, Science-Based Industrial Park, Hsin-chu (TW)

( * ) Notice: Subject to any disclaimer, the term of this patent is extended or adjusted under 35 U.S.C. 154(b) by 188 days.

(21) Appl. No.: 11/277,767

(22) Filed: Mar. 29, 2006

(65) Prior Publication Data

US 2007/0235884 A1    Oct. 11, 2007

(51) Int. Cl.
 *H01L 23/48* (2006.01)
 *H01L 23/52* (2006.01)
 *H01L 29/40* (2006.01)
(52) U.S. Cl. .............. 257/778; 257/777; 257/779; 257/734; 257/737; 257/738
(58) Field of Classification Search ........... 257/706, 257/710–719, 734, 737, 738, 777–780
See application file for complete search history.

(56) References Cited

U.S. PATENT DOCUMENTS

| | | | |
|---|---|---|---|
| 6,507,107 B2* | 1/2003 | Vaiyapuri | 257/723 |
| 7,050,304 B2* | 5/2006 | Hsu et al. | 361/719 |
| 7,126,211 B2* | 10/2006 | Yang | 257/678 |
| 2004/0235287 A1* | 11/2004 | Inoue et al. | 438/612 |

* cited by examiner

*Primary Examiner*—Zandra Smith
*Assistant Examiner*—Telly D Green
(74) *Attorney, Agent, or Firm*—Winston Hsu

(57) ABSTRACT

A flip chip substrate comprises a substrate that is defined a chip connect zone which has a plurality of first conductive pads and passive component connect zone which has at least a second conductive pads. A first patterned insulating layer within opening that covers on the chip connect zone and exposed to the first conductive pads, a second patterned insulating layer within opening that covers on the passive component connect zone and exposed to the second conductive pads, to enhance the reliability of chip package.

8 Claims, 4 Drawing Sheets

SURFACE STRUCTURE OF FLIP CHIP SUBSTRATE

BACKGROUND OF THE INVENTION

1. Field of the Invention

The invention relates to a flip chip substrate, and more particularly, to a flip chip structure with two dielectric layers defining the chip conductive zone and passive component conductive zone on the surface of the substrate.

2. Description of the Prior Art

Accompanying the progress of movable electronic devices, several different types of packages, which are light, thin, and small, have been developed. The flip chip ball grid array (FCBGA) package is one example. The FCBGA package configuration differs from conventional ones particularly in that the semiconductor die is not connected to the package substrate through conductive pads and wire bonding, but is connected to the package substrate through solder bumps or conductive polymer bumps. Therefore, the flip chip package is capable of increasing the circuit layout density and increasing performance of circuitry.

The flip chip connection is an area array connection, so it is suitable for extremely dense configurations. It is easy to say that the flip chip connection is first forming the solder bumps on the electrode pad of the die, and then the die or the chip is put on the substrate. When the alignment of the conductive pad is correct. And then fabricating the reflow process, when the solder bumps are melted the solder bump due to their surface tension became balls shape. Finally, the chip and flip chip substrate are connected, which not only surmounts the conventional wire bonding method, but it also provides electrical efficiency due to shorter connection paths.

Please refer to FIG. 1 that is a schematic diagram of a flip chip ball grid array package configuration 10 according to the prior art. The FCBGA 10 includes a substrate 12 and a die 14, wherein the die 14 is connected on the conductive pads 21 of top-surface 16 of the substrate 12 by solder bumps 32. In addition, the FCBGA package configuration 10 further includes a plurality of surface mount pads 22 and a plurality of solder ball pads 24 deposited on the top-surface 16 and the bottom-surface 18 of the substrate 12 respectively, and two solder masks 26, 28 covering portions of the top-surface 16 and the bottom-surface 18 of the substrate 12 except the conductive pads 21, surface mount pads 22, and solder ball pads 24 respectively, for solder resist layers.

Furthermore, the surface of the die 14 has a plurality of electrode pads 30 deposited on corresponding conductive pads 21 of the substrate 12. A plurality of solder bumps 32 in the FCBGA package configuration 10 are deposited between the electrode pads 30 of the die 14 and the conductive pads 21 of the substrate 12, for forming the solder joint to fixing and electrically connecting to the die 14. An underfill layer 34 can be injected between the substrate 12 and the die 14, for protecting the FCBGA package configuration 10 from outside influences, and in-suit eliminating connection stress of the solder bumps 32.

After completing the FCBGA package configuration 10, the FCBGA package configuration 10 is mounted on the print circuit board (PCB) by a plurality of solder balls 36. Then the FCBGA package configuration 10 is electrically connected to the PCB.

Because a substrate is routed from a whole substrate plate according to the prior art, for enhancing the reliability and quality of connections of the substrate and die, the presolder must be added on each conductive pad of each substrate for connecting to each electrode pad of the die. However, when performing the presolder printing process, each substrate includes a variety of sizes and densities of conductive pads, such as first conductive pads formed on the chip conductive zone, and passive component conductive pads for the passive component conductive zone. Owing to said each substrate includes a variety of sizes and densities of conductive pads that the solder mask formed on the whole substrate plate is uneven or the substrate plate is warped. There are the reasons of the presolder printing process quality cannot be adequately controlled and causing different ball sizes, different quantities of presolders, solder ball falling off, and low process yield.

SUMMARY OF THE INVENTION

It is therefore a primary objective of the claimed invention to provide a flip chip substrate utilizing different dielectric layers on the surface of the substrate to solve the above-mentioned problem.

According to the claimed invention, a surface structure of flip chip substrate comprises a substrate defined as a chip conductive zone and a passive component electric conductive zone, a plurality of first conductive pads deposited on the chip conductive zone, at least a second conductive pad deposited on the passive component conductive zone, a first insulating layer covering on the chip conductive zone of the substrate and the first conductive pads, the first insulating layer having a first patterned opening, the top-surface of the first conductive pads expose to the first opening, and a second insulating layer covering on the passive component conductive zone of the substrate and the second conductive pads, the second insulating layer having a second patterned opening, the top-surface of the second conductive pads expose to the second opening.

The claimed invention provides a substrate that makes the presolders of the chip conductive zone attain high quality and benefits the chip connected to substrate, resulting in high quality and yield.

The claimed invention further provides a substrate that can decrease the presolder printing defects owing to the uneven solder mask surface and the substrate warpage.

The claimed invention further provides a flip chip substrate that can be applied to high I/O counts and fine bump pitch of the flip chip package.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
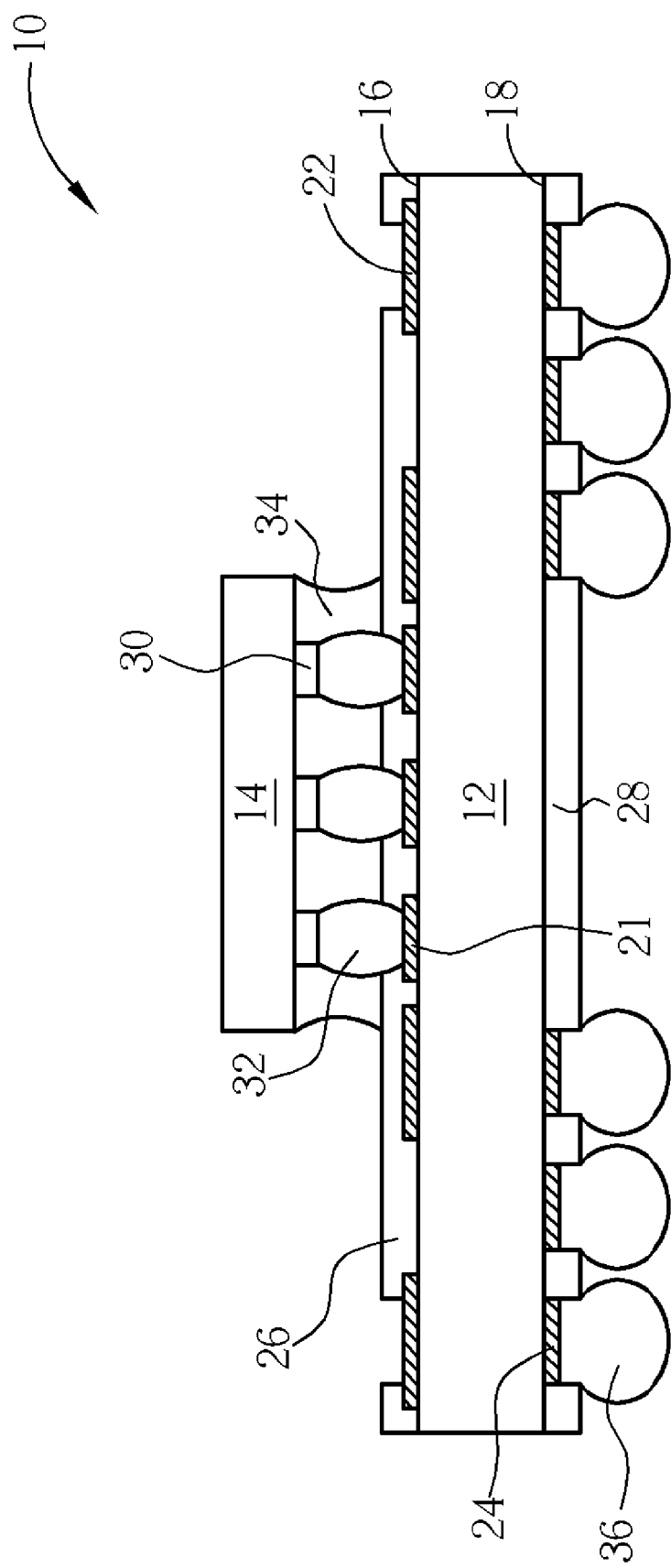
FIG. 1 is a schematic diagram of a flip chip ball grid array package configuration according to the prior art.
Figure 2:
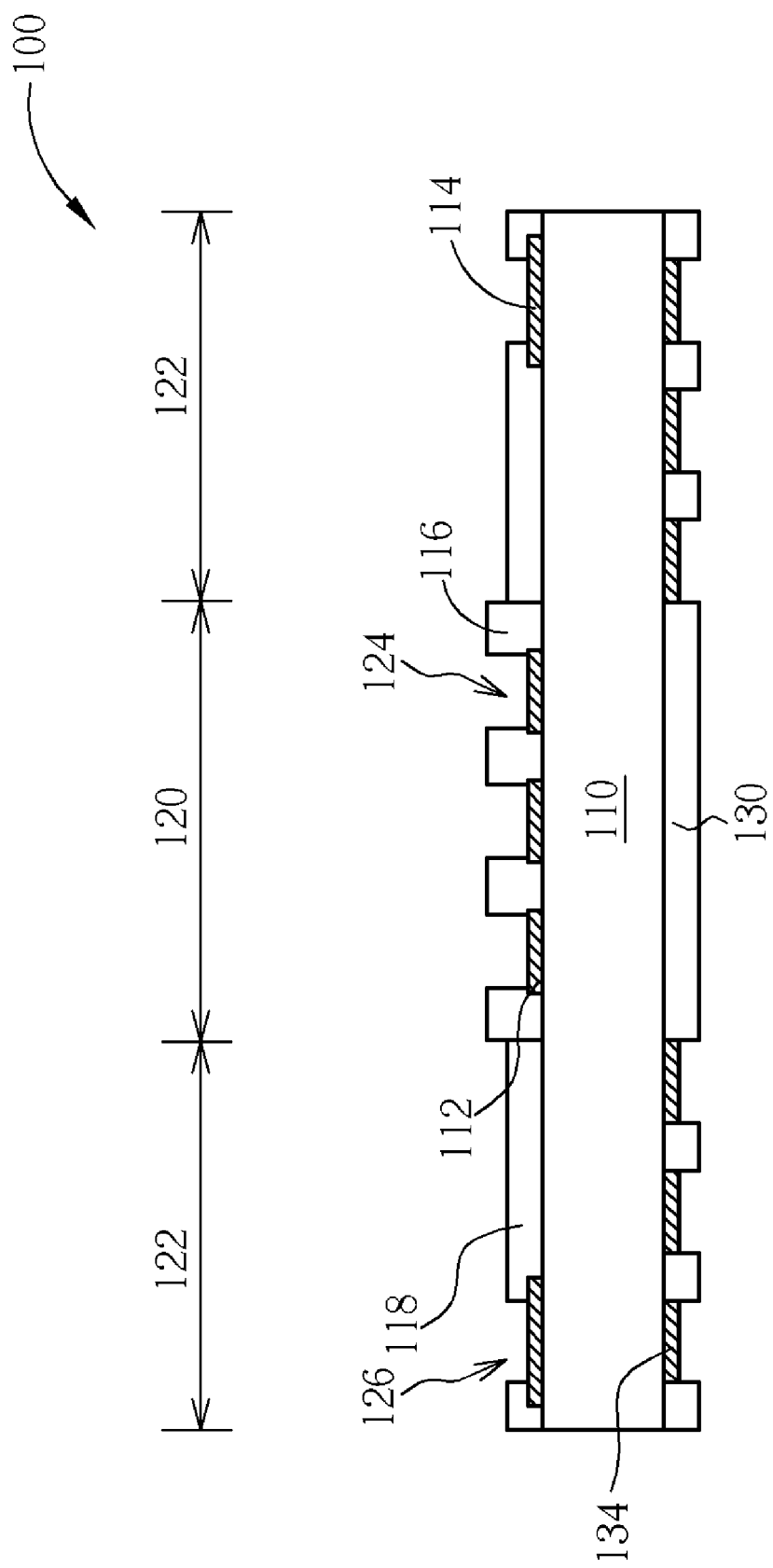
FIG. 2 to FIG. 4 are schematic diagrams of a flip chip substrate according to the present invention.
Figure 3:
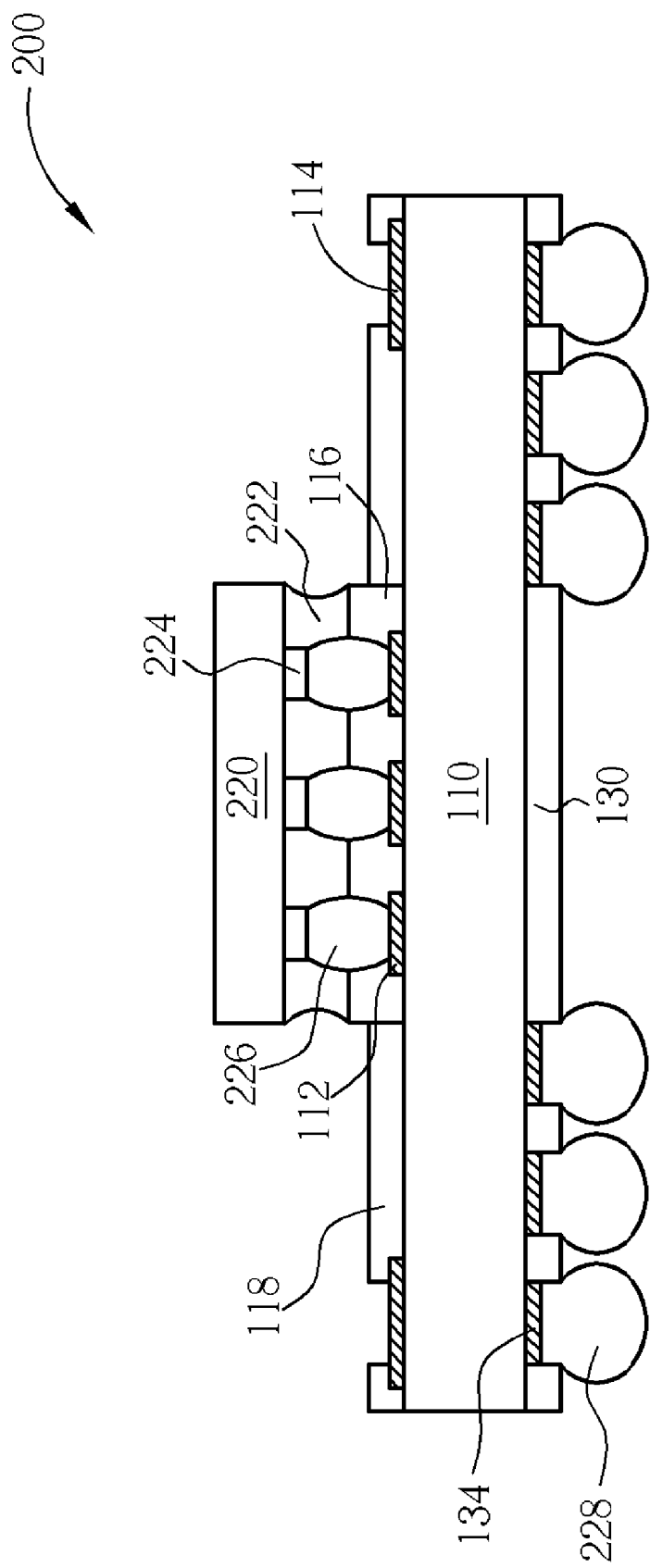
Figure 4:
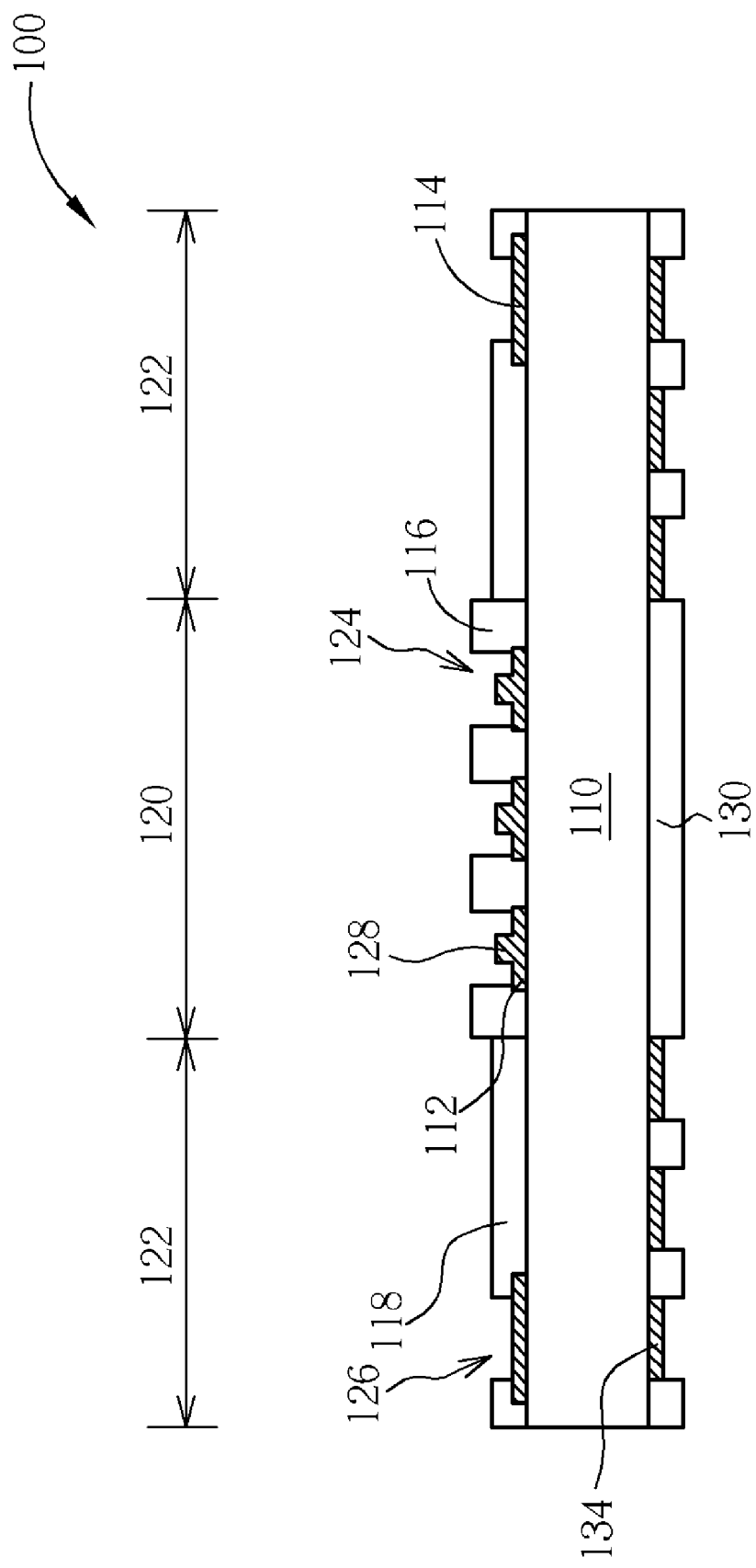

Please refer to FIG. 2 to FIG. 4 that are schematic diagrams of a flip chip substrate according to the present invention. As shown in FIG. 2, a flip chip substrate 100 includes a substrate 110 having a defined chip conductive zone 120 and passive component conductive zone 122 according to the present invention. Utilizing a conductive pad process according to prior art, a plurality of first conductive pads 112 and second conductive pads 114 are respectively made in-suit on the chip conductive zone 120 and the passive component conductive zone 122 on the surface of the substrate 110, for individual use as the chip electrode pads and the passive component electrode pads. Furthermore, a first insulating layer 116 is formed on the chip conductive zone 120 and the first conductive pads 112, and a second insulating layer 118 is formed on the passive component conductive zone 122 and the second conductive pads 114 of the substrate 110. Then, a patterning process for partial removal of the first insulating layer 116 is performed, creating a plurality of openings 124 in the first insulating layer 116 that expose each first conductive pad 112 to form the chip conductive zone 120. The same or similar patterning process creates a plurality of openings 126 in the second insulating layer 118 by partial removal of the second insulating layer 118, exposing the second conductive pads 114 to form the passive component conductive zone 122. In addition, a solder mask 130 is coated on the bottom-surface of substrate 110 and partial solder mask 130 is covered on solder ball pads 134.

The substrate 110 can be a double-layer or multi-layer circuit boards, the first insulating layer 116 can be solder resist material, organic polymer resin or epoxide resin, such as solder mask, bismaleimide trizxine (BT), polyimide (PI), benzocyclobutene (BCB), liquid crystal polymeric (LCP), polytetrafluoroethylene (PTFE), and the second insulating layer 118 can also be one from among the above-mentioned materials. It is to be noted that the present invention avoids the uneven substrate, substrate warpage, or various solder ball sizes of the prior art, and effectively controls the quality of presolder print process. Therefore, the thickness of the first insulating layer 116 needs to be greater than that of the second insulating layer 118 so that the first insulating layer 116 on the chip conductive zone 120 of each substrate of the whole substrate plate is uniformly contact with metal mask having excellent print quality. In addition, the first insulating layer 116 may directly contact the second insulating layer 118, and preferably not cover the second insulating layer 118. In other words, the present invention utilizes different thicknesses of insulating layers to solve the presolder printing process problems on a plurality of first conductive pads 112 on the chip conductive zones 120 in the whole substrate plate that have an uneven solder mask and un-uniform presolder. Also, the first insulating layer 116, formed on the chip conductive zone 120, and the second insulating layer 118, formed on the passive component conductive zone 122, can be comprised either of different materials or the same materials.

Then, as shown in FIG. 3, a plurality of solder bumps 226 are used for making a die 220 electrically connect to the flip chip substrate 100, and then an underfill resin 222 is added to the clearance among the die 220, solder bumps 226 and substrate 100 and in-suit elimination of the stress owing to the CTE (coefficient of thermal expansion) mismatch between die 220 and substrate 100. In addition, the solder bumps 226 are deposited between a plurality of electrode pads 224 of the die 220 and the first conductive pads 112 of the flip chip substrate 100, wherein the solder bumps 226 and the presolder formed on the first conductive pads 112 are reflowed to form a solder joint. After forming the FCBGA package configuration 200, the FCBGA package configuration 200 is mounted on the PCB by a plurality of solder balls 228, making the FCBGA package configuration 200 electrically connect to the PCB.

In addition, according to the mechanical structure, a plurality of conductive posts 128 are manufactured into the chip conductive zone 120, as shown in FIG. 4, for increasing the connection area of the presolder and conductive pads. Thus, according to the present invention, the conductive posts 128 are formed on the first conductive pads 112 of the openings 124 for increasing the connection area of the presolder. The first and second conductive pads 112, 114 and the conductive posts 128 can be conductive metal, such as copper, nickel, tin, gold, silver, an alloy of nickel and gold, an alloy of the copper and silver, or an alloy of the copper and tin.

To sum up, the present invention flip chip substrate, when compared to prior art, encompasses at least the following advantages:

(1) The present invention flip chip substrate utilizes two insulating layers to manufacture different thicknesses of the chip conductive zone and the passive component conductive zone, making the whole substrate plate even and have an identical connecting with metal mask. Therefore, the present invention obtains high quality for high I/O counts and fine bump pitch of presolder printing and promotes high quality and yield of package process.

(2) The present invention flip chip substrate utilizing the conductive posts formed on the conductive pads can effectively increase the contact area of the presolders and the conductive pads. Thus, the uniformity and quality of presolder is promoted, enhancing reflow quality and decreasing the voids produced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A surface structure of a flip chip substrate comprising:
   a substrate defined as a chip conductive zone and a passive component conductive zone;
   a plurality of first conductive pads formed on the chip conductive zone;
   at least a second conductive pad formed the passive component conductive zone;
   a first insulating layer covering the chip conductive zone of the substrate and the first conductive pads, the first insulating layer having first patterned openings, the top-surface of the first conductive pads expose to the first patterned openings; and
   a second insulating layer covering the passive component conductive zone of the substrate and the second conductive pads, the second insulating layer having a second patterned opening, the top-surface of the second conductive pad expose to the second opening, wherein a thickness of the first insulating layer is greater than that of the second insulating layer and the first insulating layer does not cover the second insulating layer.

2. The structure of the claim 1 wherein the substrate is double-layer or multi-layer circuit boards.

3. The structure of the claim 1 wherein the first insulating layer and the second insulating layer comprise the same materials.

4. The structure of the claim 1 wherein the first insulating layer and the second insulating layer comprise different materials.

5. The structure of the claim 1 wherein the patterned openings of the first insulating layer are formed by first forming the first insulating layer on the chip conductive zone, and then performing a patterning process to expose the first conductive pads.

6. The structure of the claim 1 wherein the patterned opening of the second insulating layer is formed by first forming the second insulating layer on the passive component conductive zone, and then performing a patterning process to expose the second conductive pad.

7. The structure of the claim 1 further comprising a plurality of conductive posts formed on a top-surface of the first conductive pads.

8. The structure of the claim 1 wherein the first and second conductive pads have presolders.

* * * * *